United States Patent
Staples

(10) Patent No.: US 11,762,002 B2
(45) Date of Patent: Sep. 19, 2023

(54) WRIST-BAND VOLTAGE DETECTOR

(71) Applicant: Grant Edward Staples, New South Wales (AU)

(72) Inventor: Grant Edward Staples, Taylors Beach (AU)

(*) Notice: Subject to any disclaimer, the term of this patent is extended or adjusted under 35 U.S.C. 154(b) by 0 days.

(21) Appl. No.: 17/859,135

(22) Filed: Jul. 7, 2022

(65) Prior Publication Data

US 2022/0341980 A1 Oct. 27, 2022

Related U.S. Application Data

(63) Continuation of application No. PCT/IB2021/051547, filed on Feb. 24, 2021.

(60) Provisional application No. 62/981,147, filed on Feb. 25, 2020.

(51) Int. Cl.
*G01R 19/155* (2006.01)
*G01R 29/12* (2006.01)

(52) U.S. Cl.
CPC .......... *G01R 29/12* (2013.01); *G01R 19/155* (2013.01)

(58) Field of Classification Search
None
See application file for complete search history.

(56) References Cited

U.S. PATENT DOCUMENTS 4,453,161 A * 6/1984 Lemelson ............. F41A 17/063
                                                   340/10.5
10,485,477 B1 * 11/2019 Lapetina ............... A61B 5/7475
2008/0024265 A1   1/2008 Jones
2012/0122519 A1 * 5/2012 Jochheim ............ H04M 1/0202
                                                    455/556.1
2017/0099888 A1   4/2017 Flynn
2017/0124371 A1 * 5/2017 Vincent ............. G06V 40/1306
2019/0379122 A1 * 12/2019 Kenkel ................ G06F 1/1698

FOREIGN PATENT DOCUMENTS

| CN | 104574809 A | 4/2015 |
| KR | 200398620 Y1 | 10/2005 |
| KR | 101538663 B1 | 7/2015 |
| WO | 2021171199 A1 | 9/2021 |

OTHER PUBLICATIONS

PCT Notification of Transmittal of the International Search Report and the Written Opinion of the International Searching Authority, or the Declaration for International Application No. PCT/IB21/51547 dated Jun. 1, 2021, which corresponds to U.S. Appl. No. 17/859,135 (11 Pages).

* cited by examiner

*Primary Examiner* — Jeff W Natalini
(74) *Attorney, Agent, or Firm* — Clark Hill PLC

(57) ABSTRACT

The inventive wrist-band voltage detector provides a wearable device for detecting the presence of AC voltage without interference with work activities. Embodiments of the inventive wrist-band voltage detector include monopole aerials positioned in each side of the wrist band. A thin flexible dielectric layer may sit between the aerials and inside of the wrist band, acting as an electrical barrier between the aerials and the user's wrist. The aerials are connected to conventional voltage detector circuitry on a circuit board located on the top side of the wrist band. The circuit board is grounded to the user's wrist, which enhances the circuitry's ability to detect the presence of nearby AC voltage at a safe distance.

20 Claims, 2 Drawing Sheets

WRIST-BAND VOLTAGE DETECTOR

RELATED APPLICATIONS

This application claims the benefit of U.S. Provisional Application No. 62/981,147.

BACKGROUND OF THE INVENTION

The commercial use of alternating current (AC) has been changing the world for more than a century and is a major driver for all modern growth in the world. Residences, office buildings, factories, and naval vessels all use AC, however, because AC does not have a presence that can be readily detected by the five senses, AC poses risks of injury and even death to workers in those environments who may unwittingly come into contact with an exposed source of AC. For example, even though an electrician working on a power distribution panel may have been told that power has been turned off, another worker may have subsequently reenergized the panel. As another example, a power line may have been downed by a windstorm, and a first responder will have no idea whether or not the power line remains "live." As another example, a plumber repairing a broken copper pipe may be unaware that elsewhere in the building an exposed wire has come into contact with a distant end of the same copper pipe. Every year, there are thousands of accidental electrocutions in occupational settings, making electrical injuries the fourth-leading cause of workplace-related traumatic death.

In order to detect the presence of AC, workers may use non-contact AC voltage detectors which detect the changing electric and magnetic fields around an AC-carrying conductor. The technology behind non-contact AC voltage detection is well-understood and commercial hand-held detectors are readily available in the marketplace. However, commercially-available hand-held detectors are inconvenient in that they require the user to remove the detector from a toolbox or pocket, bring the detector probe(s) near the conductive material, and then return the detector to the toolbox or pocket. This inconvenience may transform into actual risk of accidental electrocution. For example, at the beginning of the job, an electrician may confirm, using a hand-held detector, that a circuit box is not energized. However, during the course of work on the circuit box, there is a risk that someone may reconnect power to the circuit box. While best practices may require the electrician to check periodically for the presence of live voltage, as a practical matter, the electrician may choose not to follow best practices or may simply forget to check for the presence of live voltage as frequently as necessary.

Instead of using a separately-held device, a non-contact AC voltage detector could be incorporated into something that the worker would be carrying or wearing as part of the course of performance of the work. One choice might be something that the worker may be wearing on the hand or wrist, so that the worker can regularly monitor for live voltage without disruption of work. For example, pending application PCT/IB2019/001379 discloses a voltage detector that is incorporated into a glove such that it is a fully-functional glove and a fully-functional voltage detector. However, for some work environments, wearing a glove may prove uncomfortable or cumbersome, and despite the advantages of a wearable voltage detector, a worker may choose comfort and ease of use over safety. As an alternative to a glove-based voltage detector, a voltage detector that can be worn on the wrist may provide greater comfort and convenience without sacrificing safety. Prior art disclosures such as U.S. Pat. Pub. 20080024265, U.S. Pat. Pub. 20040080320, and U.S. Pat. No. 4,983,954 disclose the concept of a voltage detector worn on the wrist; however, these and other devices in the prior art fail to take into account any effect that the human body will have on the quality and strength of the detected signal.

Thus, what is needed is a voltage detector that can be worn on the wrist and that takes into account the effect that the human body will have on the quality and strength of the detected signal.

SUMMARY OF THE INVENTION

Embodiments of the inventive wrist-band voltage detector solve the problem of incorporating an AC voltage detector into a wearable device while taking into account the effects of the human body on the detection of the AC voltage. More particularly, embodiments of the inventive wrist-band voltage detector use thin, lightweight monopole aerials extending through the wrist-band. The aerials are separated from the user's wrist with a thin layer of dielectric material acting as an electrical barrier. This provides suitable sensitivity, from a safe distance, to any nearby AC voltage, and it does not require the user to hold the detector at a particular angle to the conductive material.

Further, embodiments of the inventive wrist-band voltage detector include AC voltage detection and alerting circuitry connected to the aerials. This circuitry provides, at a minimum, the capability to detect the presence of AC voltage, eliminate background noise, and alert the user to the presence of dangerous AC voltage. Unlike the prior art however, this circuitry includes a ground connection in physical contact with the user's body, making the detection circuitry more sensitive to the presence of AC voltage. This increased sensitivity allows for the use of a thinner dielectric layer separating the aerials from the user's wrist.

Further, in some embodiments, the detection circuitry may include a microcontroller or microprocessor, non-volatile memory, an accelerometer, a GPS receiver, a motion-powered charger, visual, audio, and/or haptic alert components, wired or wireless communications interfaces, a watch, a user display, and/or an activity tracker. Such additional components, while not necessary for the detection of AC voltage, provide additional beneficial convenience and operational features to the inventive wrist-band voltage detector.

Upon review of the drawings and detailed descriptions that follow, those skilled in the art will recognize other alternative embodiments of the inventive wrist-band voltage detector.

DETAILED DESCRIPTION OF THE INVENTION

The inventive wrist-band voltage detector may be implemented in a variety of embodiments, including the following first embodiment which provides sufficient details so as to enable a person of ordinary skill in the art to make and use the invention without extensive experimentation, as well as variations on this first embodiment that may prove beneficial for certain applications and configurations.

First Embodiment

Figure 1:
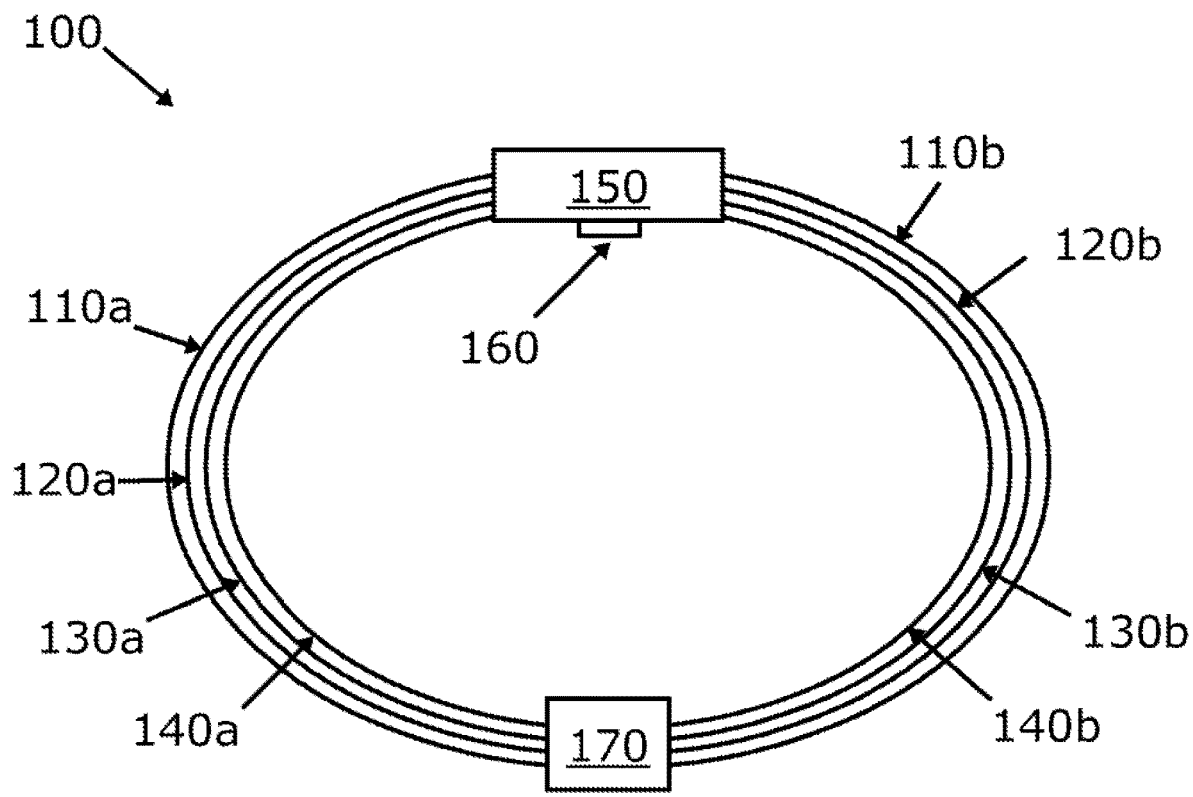
FIG. 1 is a cutaway view of the side of an embodiment of the inventive wrist-band voltage detector.

In a first embodiment of the inventive wrist-band voltage detector shown in FIG. 1, detector 100 comprises outer wrist-band layers 110a and 110b, monopole aerials 120a and 120b, dielectric layers 130a and 130b, inner wrist-band layers 140a and 140b, circuit board assembly 150, ground button 160, and buckle 170.

Outer wrist-band layers 110a and 110b comprise flexible plastic and provide structural shape to detector 100 and physical protection of aerials 120a and 120b.

Figure 2:
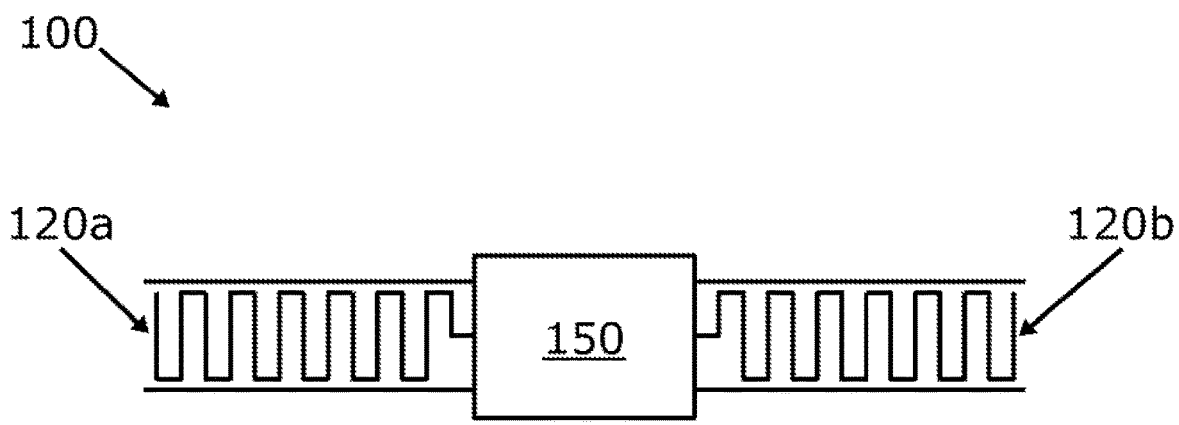
FIG. 2 is a cutaway view of the top of an embodiment of the inventive wrist-band voltage detector.
Figure 3:
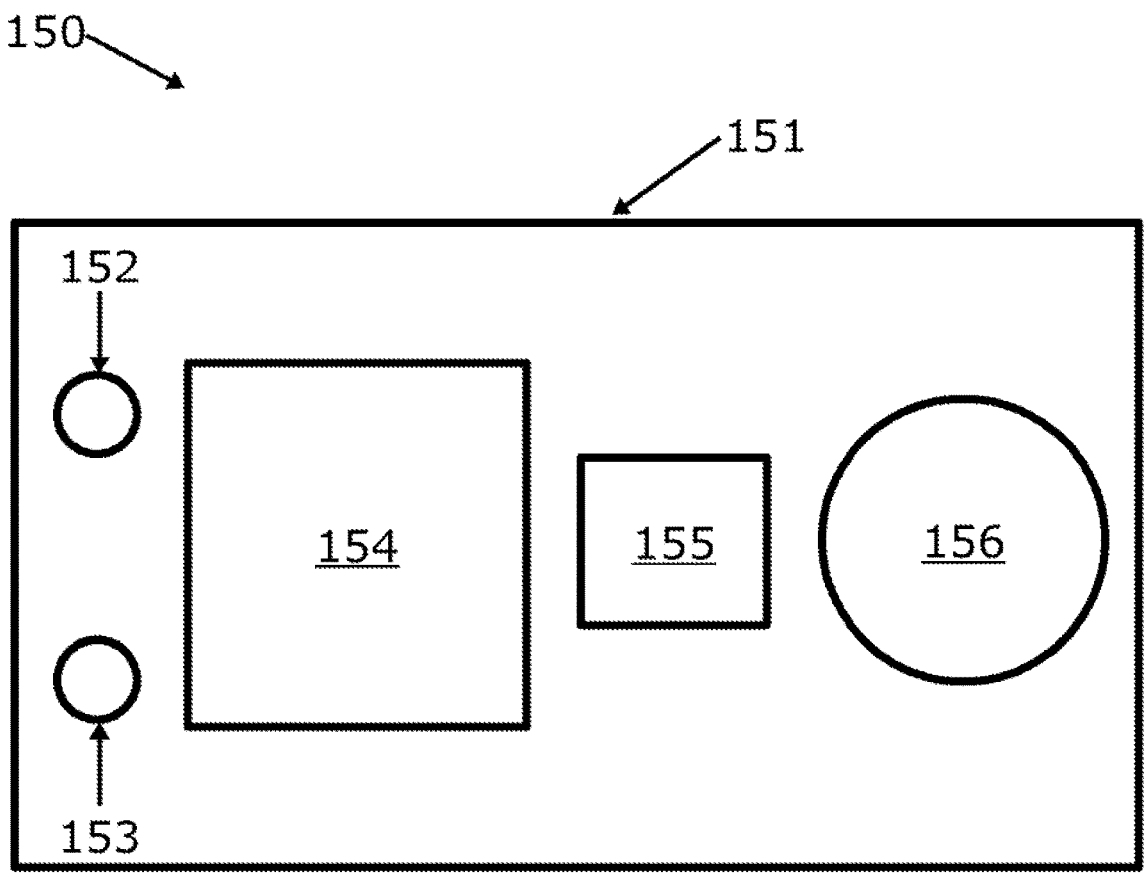
FIG. 3 is diagram of the logical layout of the circuit board in an embodiment of the inventive wrist-band voltage detector.

Aerials 120a and 120b comprise conductive printed circuits on a single or multilayer flexible dielectric substrate such as polyimide or polyester. The conductive printed circuits are arranged in a serpentine pattern as suggested by FIG. 2. The conductive printed circuits of aerials 120a and 120b each electrically connect to aerial connector 152 (FIG. 3). Aerials 120a and 120b are not connected on their distal ends.

Dielectric layers 130a and 130b comprise 3 mm neoprene which prevents leakage of any AC voltage detected by aerials 120a and 120b into the user's wrist.

Inner wrist-band layers 140a and 140b comprise flexible plastic and provide structural shape to detector 100.

Figure 4:
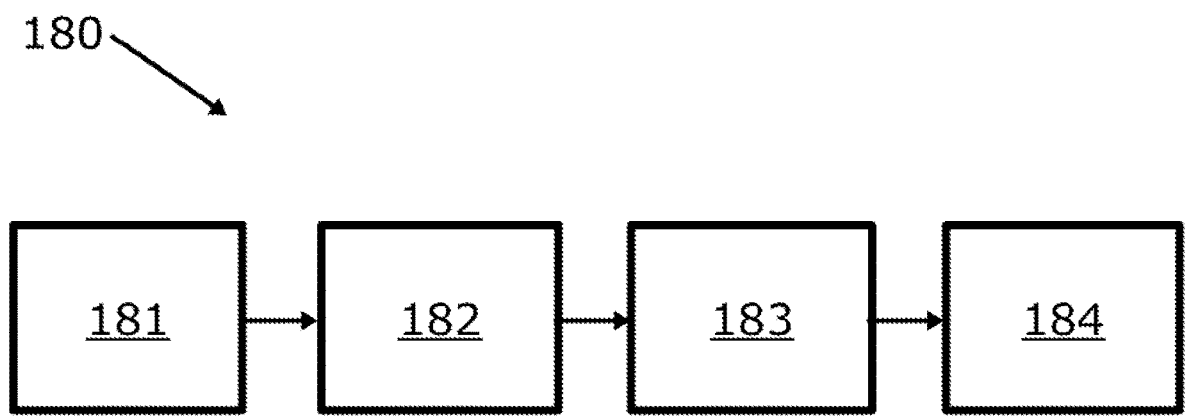
FIG. 4 is a block diagram of the functionality performed by the components of the circuit board in an embodiment of the inventive wrist-band voltage detector.

As shown in FIG. 3, circuit board assembly 150 comprises printed circuit board 151, aerial connector 152, ground connector 153, AC voltage detection components 154 (which comprise various resistors, capacitors, transistors, traces, and the like, as needed to perform the functions described in block diagram 180 shown in FIG. 4), surface mount buzzer 155, and surface mount coin cell holder 156 (suitable for holding a CR2032 3v coin cell battery which provides power to circuit board 151). The components of circuit board 151 are physically arranged to provide optimal performance as would be known to one of ordinary skill in the art of designing circuit board layout. Circuit board assembly 150 further comprises a protective case (not shown) and suitable mechanisms (not shown) for physically attaching the protective case to outer wrist-band layers 110a and 110b and inner wrist-band layers 140a and 140b.

Ground button 160 comprises conductive material and is intended to contact the skin of the user's hand at the user's wrist when worn. Ground button 160 electrically connects to ground connector 153.

Buckle 170 provides a suitable mechanism for attaching and detaching the two sides of the wrist band to each other, as would be known to one of ordinary skill in the art.

Block diagram 180, shown in FIG. 4, describes the functionality of the components of circuit board 151 when signals arrive from aerials 120a and 120b at aerial connector 152. The electrical signal first passes through band pass filter 181, which eliminates very low and very high frequency signals, for example, low-frequency static fields and high-frequency fields caused by switch-mode power supplies. The signal output from band-pass filter 181 then passes through frequency comparator 182, which compares the filtered signal with a reference signal. When the filtered signal has a higher frequency than that of the reference signal, the output of comparator 182 is low, and when the filtered signal has a lower frequency than that of the reference signal, the output of comparator 182 is high. Thus, in the presence of a sufficiently strong AC voltage, the signal output from comparator 182 is a square wave with a frequency equal to that of the electrical signal received by aerials 120a and 120b. This signal feeds into peak detector 183, which outputs a DC voltage equal to the peak value of the signal from comparator 182. The output of peak detector 183 drives the circuitry of audio annunciator circuit 184 which cause buzzer 155 to emit an audible alert when it receives a sufficient signal. Thus, when aerials 120a and 120b are in proximity to AC voltage, the detected voltage results in an audible alert from buzzer 155, and when aerials 120a and 120b are not in proximity to AC voltage, buzzer 155 will remain silent.

Alternative and Additional Embodiments

The inventive wrist-band voltage detector as described in the foregoing embodiment may be modified and/or extended by one of ordinary skill in the art without departing from the spirit of the inventive voltage detector, so long as (a) aerials 120a and 120b are electrically isolated from the user's hand and (b) ground button 160 maintains contact with the user's hand. Selection of some of these modifications and extensions may affect the quality of the general operation of the inventive wrist-band voltage detector in terms of performance when used for particular applications. Selection of other modifications and extensions may be driven by costs of manufacture, availability of materials, physical constraints, and other factors which may be independent of the general operation of the inventive wrist-band voltage detector. The following variations represent a non-exclusive description of examples of other embodiments which may be mixed and matched as needed and as technically feasible without affecting the general functionality of the inventive wrist-band voltage detector.

In some embodiments, the insulative functionality of dielectric layers 130a and 130b may be provided by the dielectric flexible printed circuit board substrate used for aerials 120a and 120b. In other embodiments, the insulative functionality of dielectric layers 130a and 130b may be provided by inner wrist-band layers 140a and 140b. In other embodiments, dielectric layers 130a and 130b and inner wrist-band layers 140a and 140b may both be present, and may both provide some measure of electrical isolation of aerials 120a and 120b from the user's wrist. In other embodiments, dielectric layers 130a and 130b may comprise flexible insulative material other than neoprene. In other embodiments, dielectric layers 130a and 130b may range in thickness between 0.25 mm and 3 mm.

In some embodiments, outer wrist-band layers 110a and 110b, aerials 120a and 120b, dielectric layers 130a and 130b, and inner wrist-band layers 140a and 140b may be laminated together to form a single solid component. In other embodiments, each may be a discrete component.

In some embodiments, aerials 120a and 120b extend the entire span between circuit board assembly 150 and buckle 170. In other embodiments, aerials 120a and 120b only extend only part of the span between circuit board assembly 150 and buckle 170.

In some embodiments, aerials 120a and 120b may comprise 40-gauge polyurethane-insulated copper Litz wire arranged in coils lying flat between outer wrist-band layers 110a and 110b and dielectric layers 130a and 130b.

In some embodiments, outer wrist-band layers 110a and 110b and inner wrist-band layers 140a and 140b may comprise elastic material such that the inventive wrist-band voltage detector fits snuggly against the user's wrist without the need for buckle 170. In other embodiments, outer wrist-band layers 110*a* and 110*b* and/or inner wrist-band layers 140*a* and 140*b* may further comprise Velcro® or other mechanisms commonly used attached, detaching, and adjusting wrist straps.

In some embodiments, ground button 160 may be located elsewhere on the inventive wrist-band voltage detector than directly under circuit board assembly 150. In some embodiments there may be multiple ground buttons. In some embodiments, ground button 160 may be incorporated into buckle 170.

In some embodiments, circuit board assembly 150 may further comprise a display screen indicating, for example, "safe" and "danger" conditions. Further, the display screen could include convenience functions such as the time, text messages, expiration of timers, a step counter, and/or the user's pulse rate. Further, buzzer 155 could be replaced with a surface mount micro speaker such that annunciator circuit 184 could cause the speaker to emit an alert that changed pitch or volume in proportion to the proximity and/or strength of the AC voltage; the micro speaker could also be used to emit a vocal alert. Further, circuit board assembly 150 may include a haptic indicator that vibrates when dangerous AC voltage is detected; such indicators may prove useful in noisy environments.

In some embodiments, the functionality provided by some or all of the discrete components of printed circuit board 151 could be performed by an application-specific integrated circuit (ASIC). Use of an ASIC could reduce the footprint of the circuitry mounted on printed circuit board 151 and thus reduce the size and weight of printed circuit board 151.

In some embodiments, the functionality provided by some or all of the discrete components of printed circuit board 151 could be performed by a low-power microcontroller. Use of a programmable microcontroller could, for example, provide better analysis of detected signals to reduce false positives, provide a greater degree of customizable features such as optimizing detector 100 for particular operating environments, extracting additional information about detected signals such as strength, frequency, and harmonic distortion, and logging of significant events in the microcontroller's non-volatile memory for later access. Significant events may include, for example, the detection of dangerous voltage, power on/off, configuration changes, recalibration, and the like. Further, the addition of a GPS receiver to circuit board 151 could provide location to the information logged about significant events. Further, the presence of a programmable microcontroller could simplify external connectivity as described in the following paragraph.

In some embodiments, circuit board 151 further comprises communications hardware for connecting detector 100 to an external device such as a portable computer, smart phone, or computer network. The communications hardware may include a wired connector, such as a USB or Lightning port, or it may include wireless radio transceiver suitable for use with Bluetooth, ZigBee, IEEE 802.11x, or other wireless protocol. The presence of a microcontroller as part of the circuitry present on circuit board 151 simplifies external communications since such microcontrollers may include integrated transceivers and embedded protocol stacks. Detector 100 may transmit the occurrence of significant events to the external device in real time, for example to provide instantaneous reports to the worker's supervisor, or in non-real time, for example, at the end of the workday when detector 100 is plugged into the external device for recharging. Further, the external device could send configuration, software updates, and other operational information to the microprocessor via application software running on the external device.

In some embodiments, the power source for circuit board 151 may comprise rechargeable batteries, which can be recharged by physical connection of detector 100 to a power source, for example, via a USB cable, by placing detector 100 in proximity to a wireless charging pad, by a kinetic energy charger incorporated into detector 100, or by the electric field that detector 100 is designed to detect. In the latter embodiment, an energy storage circuit would be required to store small amount of energy collected by the electric field.

In some embodiments, the signals received via aerials 120*a* and 120*b* at circuit board 151 could be conditioned prior to passing through band pass filter 181. By way of example, such conditioning may include the use of a large resistor connected to ground to ensure that the input to band pass filter 181 remains low except in the absence of AC voltage. Circuit board 151 may also include components to match the impedance of aerials 120*a* and 120*b* in order to maximize signal received by band pass filter 181.

In some embodiments, the signals received via aerials 120*a* and 120*b* could be individually processed and analyzed; such individual signal processing could provide, for example, additional information about the physical position of the AC voltage with respect to aerials 120*a* and 120*b*.

In some embodiments, the functionality of the components of circuit board 151 may be manually or dynamically configurable. For example, in the U.S., the AC voltage is 60 Hz while in Australia, AC voltage is 50 Hz. A manual switch on detector 100 could change the circuitry from one frequency to another, or alternatively, the circuitry could be automatically configured to the proper frequency by holding detector 100 near an active AC voltage conductor.

In some embodiments, a low-voltage detection circuit could be incorporated in the components of circuit board 151. This could alert the user that the power source (for example, the on-board battery) was too weak for proper operation.

In some embodiments, a motion detector, such as an accelerometer, could sense when detector 100 was not in use and put the components of circuit board 151 into a low power sleep mode; the motion detector could also sense when detector 100 was in use, putting the components of circuit board 151 back into normal operation mode. In other embodiments, detector 100 may include a power switch that allows the user to turn the power to circuit board 151 on and off.

In some embodiments, aerials 120*a* and 120*b* could be connected at their distal ends to form a loop antenna rather than two monopole antennas. Such a configuration would eliminate the use of buckle 170, but may require the use of (a) elastic in the wrist band in order to ensure predictable contact between ground button 160 and the user's skin and (b) a substrate for aerials 120*a* and 120*ba* comprising a flexible circuit board that could stretch lengthwise, for example by using an accordion-style flexible circuit board, a coiled Litz wire connecting aerials 120*a* and 120*b*, or other suitable mechanism.

In some embodiments, circuit board 150 could be part of the same flexible printed circuit upon which the copper circuits of aerials 120*a* and 120*b* are attached, obviating the need for aerial connector 152 or ground connector 153. In other embodiments, circuit board 150 may be separate from the flexible printed circuit upon which the copper circuits of aerials 120*a* and 120*b* are attached; in such embodiments, circuit board 150 could utilize either flexible or rigid circuit board material.

In some embodiments, outer wrist-band layers 110*a* and 110*b* and inner wrist-band layers 140*a* and 140*b* may be formed by as part of an over-molded plastic enclosure. In some related embodiments, the enclosure may also enclose circuit board 150. Such configurations, particular where the circuitry of aerials 120*a* and 120*b* are on the same flexible printed circuit as circuit board 150, may simplify manufacturing and lower costs, although the over-molding process may be somewhat complicated if detector 100 includes any visual interface elements, such as LEDs, a clockface, or a video display. In other embodiment, having a detachable strap may be more advantageous because it would allow for simpler repair and replacement of broken parts.

In some embodiments, the voltage detection components 154, surface mount buzzer 155, surface mount coin cell holder 156, and the conductive printed circuits of aerials 120*a* and 120*b* could all be mounted on a single flexible circuit board, with flexible circuit board could be inserted into the inside of a hollow wrist band comprising durable elastic material, and a protective enclosure placed around the voltage detection components 154, surface mount buzzer 155, surface mount coin cell holder 156. Such an embodiment, while perhaps less durable and/or effective, might be less costly than other embodiments.

The invention claimed is:

1. A wearable AC voltage detector comprising:
a circuit board assembly comprising a dielectric substrate and a plurality of electronic components mounted to the dielectric substrate, the plurality of electronic components comprising voltage detection components, a power supply, and an annunciator;
a wrist-band comprising a first segment and a second segment, each segment comprising an outside layer, a flexible circuit board comprising a monopole aerial printed on a dielectric substrate, a dielectric layer, an inner layer, and a wrist-band segment connector, where each segment has a proximal end and a distal end; and
a ground button, where:
the proximal end of each segment is physically connected to the circuit board assembly,
the distal end of each segment is physically connected to the wrist-band segment connector,
the aerial of each segment comprises conductive material printed on the dielectric substrate of the segment in a serpentine pattern and is electrically connected to the voltage detection components,
the ground button is electrically connected to the voltage detection components,
the wrist-band segment connectors of each segment are configured to attach the distal end of the first segment to the distal end of the second segment such that when the voltage detector is worn around a user's wrist the ground button is held in contact with the user's skin, and
the plurality of electronic components and aerials work cooperatively to alert the user of a proximity of the AC voltage.

2. The voltage detector of claim 1, where:
the dielectric substrate of the first segment, the dielectric substrate of the second segment, and the dielectric substrate of the circuit board assembly comprise discrete substrates.

3. The voltage detector of claim 1, where:
the dielectric substrate of the first segment, the dielectric substrate of the second segment, and the dielectric substrate of the circuit board assembly comprise a single continuous substrate.

4. The voltage detector of claim 1, where:
the ground button is positioned under the circuit board assembly.

5. The voltage detector of claim 1, where
the ground button is positioned on the inner layer of one of the segments.

6. The voltage detector of claim 1, where:
the wrist-band segment connector of the first segment is a buckle and
the wrist-band segment connector of the second segment is a plurality of holes configured to mate with the buckle.

7. The voltage detector of claim 1, where:
the wrist-band segment connector of the first segment is a Velcro hook and the wrist-band segment connector of the second segment is a Velcro loop.

8. The voltage detector of claim 1, where:
the inside layer and outside layer of each segment comprise elastic material and
the wrist-band segment connector of the first segment is directly connected to the wrist-band segment connector of the second segment.

9. The voltage detector of claim 1, where:
the voltage detection components comprise a band pass filter, a frequency comparator, a peak detector, and an annunciator driver circuit implemented on an application-specific integrated circuit.

10. The voltage detector of claim 1, where:
the voltage detection components comprise a band pass filter, a frequency comparator, a peak detector, and an annunciator driver circuit implemented as discrete components.

11. The voltage detector of claim 1, where:
the plurality of electronic components further comprises a microcontroller having a processor and non-volatile memory and
the non-volatile memory stores instructions for performing operations to implement the functionality of voltage detections components.

12. The voltage detector of claim 11 where:
the instructions for performing communications further comprise instructions for sending information about the detection of the proximity of the AC voltage to the aerials.

13. The voltage detector of claim 1, where:
the dielectric layer of each segment comprises neoprene about 3 mm in thickness.

14. The voltage detector of claim 1, where:
where the dielectric layer comprises neoprene about 1.5 mm in thickness.

15. The voltage detector of claim 1, where:
where the dielectric layer comprises neoprene about 0.25 mm in thickness.

16. The voltage detector of claim 1, where:
the dielectric layer of each segment comprises the dielectric substrate of each segment.

17. The voltage detector of claim 1, where:
the outer layer and the inner layer of each segment are formed as an over-molded flexible plastic enclosure.

18. A voltage detector comprising:
a flexible circuit board comprising a dielectric substrate, a plurality of electronic components mounted to the dielectric substrate, the plurality of electronic components comprising voltage detection components, a power supply, an annunciator, and a serpentine monopole aerial printed on the dielectric substrate;

a ground button electrically connected to the voltage detection components;

a flexible over-molded plastic enclosure surrounding the flexible circuit board; and a buckle positioned at one end of the plastic enclosure and configured to attach to one of a plurality of holes on the other end of the plastic enclosure to form a wearable wrist-band, where:

the ground button is positioned such that when the wrist-band is worn by a user, the ground button is held in direct physical contact with the skin of the user and the plurality of electronic components works cooperatively to alert the user of the proximity of an AC voltage.

19. The voltage detector of claim 18, further comprising:

a layer of neoprene between the dielectric substrate and the plastic enclosure, where the layer of neoprene further electrically isolates the aerial from the skin of the user.

20. A voltage detector comprising:

a flexible circuit board comprising voltage detection circuits, a power supply, an annunciator, and a serpentine monopole aerial printed on the circuit board;

a protective enclosure surrounding the voltage detection components, the power supply, and the annunciator;

a wrist-band physically connected to the protective enclosure and surrounding the aerial; and a ground button positioned on the inside of the wrist-band, where:

the aerial is electrically connected to the voltage detection components, the ground button is electrically connected to the voltage detection components, the wrist-band comprises dielectric elastic material such that when the voltage detector is worn by a user, the button is held in direct physical contact with the skin of the user, and the voltage detector alerts the user of the proximity of an AC voltage.

* * * * *